(12) United States Patent
Ju (10) Patent No.: US 6,236,089 B1
(45) Date of Patent: May 22, 2001

(54) CMOSFET AND METHOD FOR FABRICATING THE SAME

(75) Inventor: Jae Il Ju, Chungcheongbuk-do (KR)

(73) Assignee: LG Semicon Co., Ltd., Chungcheongbuk-Do (KR)

( * ) Notice: Subject to any disclaimer, the term of this patent is extended or adjusted under 35 U.S.C. 154(b) by 0 days.

(21) Appl. No.: 09/495,663

(22) Filed: Feb. 1, 2000

Related U.S. Application Data

(62) Division of application No. 09/003,809, filed on Jan. 7, 1998, now Pat. No. 6,069,030.

(51) Int. Cl.$^7$ ............................................... H01L 21/8238
(52) U.S. Cl. ........................ 257/369; 257/213; 257/335; 257/341; 438/199
(58) Field of Search ..................... 438/199; 257/213, 257/335, 341, 369

(56) References Cited

U.S. PATENT DOCUMENTS

| | | | |
|---|---|---|---|
| 3,745,072 | 7/1973 | Scott | 148/175 |
| 3,919,765 | 11/1975 | Schloetterer | 29/571 |
| 4,002,501 | 1/1977 | Tamura | 148/1.5 |
| 4,091,527 | 5/1978 | Goodman et al. | 29/571 |
| 4,097,314 | 6/1978 | Schlesier et al. | 148/188 |
| 5,298,434 | 3/1994 | Strater et al. | 437/21 |
| 5,391,903 | 2/1995 | Strater et al. | 257/351 |
| 5,696,016 | * 12/1997 | Chen et al. | |
| 5,905,284 | * 5/1999 | Fujii et al. | |

* cited by examiner

Primary Examiner—Kevin M. Picardat
Assistant Examiner—D. M. Collins
(74) Attorney, Agent, or Firm—Morgan, Lewis & Bockius LLP (57) ABSTRACT

A repairable CMOSFET includes an insulating substrate, a first semiconductor layer of a first conductivity type and a second semiconductor layer of a second conductivity type formed on the insulating substrate, defined as a center and two edges, and spaced apart from each other by a predetermined distance, a third semiconductor layer of a second conductivity type formed to have a predetermined length extending from the edges of the first semiconductor layer of a first conductivity type toward the second semiconductor layer of a second conductivity type, a fourth semiconductor layer of a first conductivity type formed to have a predetermined length extending from the edges of the second semiconductor layer of a second conductivity type to have symmetry to the third semiconductor layer of a second conductivity type, a insulating layer formed on the entire surfaces of the first, second, third, and fourth semiconductor layers, and a gate electrode formed between the centers of the first and second semiconductor layers, among the first, second, third, and fourth semiconductor layers.

3 Claims, 14 Drawing Sheets

CMOSFET AND METHOD FOR FABRICATING THE SAME

This is a divisional of application Ser. No. 09/003,809 filed on Jan. 7, 1998 now U.S. Pat. No. 6,069,030.

BACKGROUND OF THE INVENTION

1. Field of the Invention

The present invention relates to semiconductor devices and, more particularly, to a repairable complementary metal oxide semiconductor field effect transistor (CMOSFET) and a method for fabricating the same.

2. Discussion of the Related Art

The metal oxide semiconductor (MOS) technique was developed before 1960. In the MOS technique, the surface of a semiconductor is processed with a silicon oxide film to provide a good insulation characteristic. This has improved the performance of transistors and the fabricating method thereof.

The MOS technique gave an impetus to the practical use of semiconductor surface devices, and the first field effect transistor (FETs) became known around 1962.

P channel MOS, N channel MOS, and complementary MOS (CMOS) are all MOSFET devices. When MOS devices started to be produced, PMOS devices were preferred due to its facility of adjusting power consumption and advantages in the processes in fabricating integrated circuits. The speed of MOS devices has become much more important, and NMOS devices have become preferred because the mobility of carriers is two and a half times as fast as the mobility of holes. As for CMOS devices, their integration density is significantly lower and their fabricating process is quite complex in comparison with NMOS devices and PMOS devices. However, CMOS devices have very good power consumption. Currently, NMOS is utilized for the memory cells of a semiconductor devices and CMOS for periphery circuits.

CMOS is classified into bulk CMOS and SOI (silicon on insulator) CMOS. In bulk CMOS, a semiconductor device is constructed from the inside of a semiconductor substrate. In SOI CMOS, a silicon single crystalline thin film is formed on a insulating layer and a semiconductor device is formed thereon. The SOI structure is advantageous because all capacitances and parasitic effects relating to the substrate can be ignored and CMOS circuits can be produced without length latch-up or soft errors.

There are three types of SOI techniques. One of them is an epitaxial growth method in which a thin film of single crystal silicon is grown on a single crystalline insulating layer such as sapphire. Another technique is the deposition recrystallization method in which a polycrystalline or amorphous silicon thin film is deposited on an oxide insulating layer to be laterally melted and recrystallized or transformed into a solid phase epitaxy. The third method is a single crystallization division method in which an insulating layer such as an oxide layer is buried in a semiconductor substrate.

Silicon on sapphire (SOS) represents the epitaxial deposition method. In a melting recrystallization method, which belongs to the deposition recrystallization method, a portion of a polysilicon thin film deposited on an oxide layer by a chemical vapor depostion (CVD) process is heated by an energy beam, such as a laser beam or electron beam, and the melted portion of the polysilicon thin film is recrystallized on the wafer to form a single crystalline thin film. In the solid phase epitaxy method, amorphous silicon is deposited on crystallization areas of an insulating layer on a semiconductor substrate and then is annealed to be epitaxially grown. In the single crystallization division method, oxygen ions and nitrogen ions are implanted into a single crystalline silicon substrate so that an oxide layer or a nitride layer is buried in the substrate except the single crystalline silicon layer of a surface layer. In particular, the method of implanting oxygen ions is called separation by implanted oxygen (SIMOX) method.

As described above, the SOI structure has various advantages. In particular, an SOI CMOS is useful and advantageous because of good power consumption, high integration, low generation rate of soft errors, low generation of latchup, and high speed operation.

Figure 1:
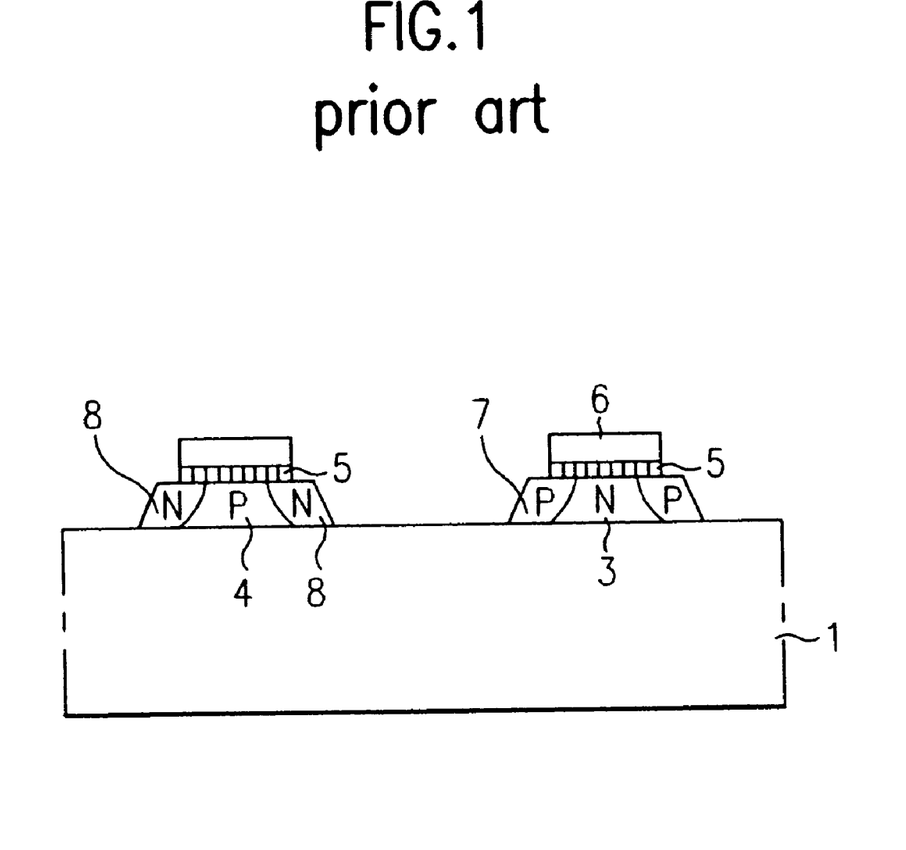
FIG. 1 is a cross-sectional view showing a structure of a conventional CMOSFET.

A conventional CMOSFET using an SOI structure and a method for fabricating the same will be discussed with reference to the accompanying drawings. FIG. 1 is a cross-sectional view of a conventional CMOSFET having a silicon on sapphire (SOS) structure. First, an n-type mesa silicon layer 3 and a p-type mesa silicon layer 4 are selectively formed on a sapphire substrate 1. A gate insulating layer 5 and a gate electrode 6 are successively formed on each of the n-type mesa and the p-type mesa silicon layers 3 and 4. N-type impurity regions 8 are formed in the p-type mesa silicon layer 4 at both sides of the gate electrode 6 and p-type impurity regions 7 are formed in the n-type mesa silicon layer 3 at both sides of the gate electrode 3. In this case, the n-type and p-type impurity regions 8 and 7 are all used as source and drain regions of a transistor.

FIGS. 2a to 2e are cross-sectional views showing the process steps of a method for fabricating the conventional CMOSFET of FIG. 1.

Figure 2A:
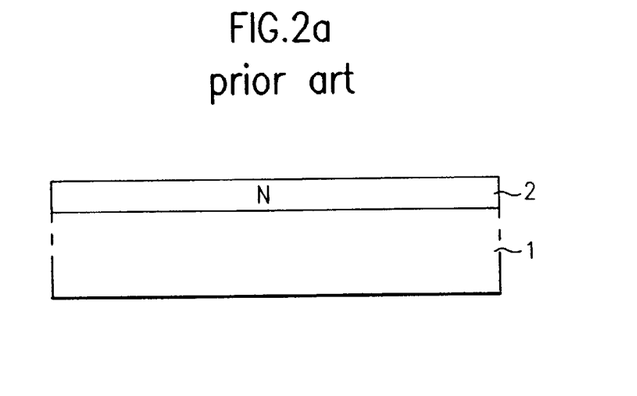
FIGS. 2a to 2e are cross-sectional views showing process steps of a conventional method for fabricating a CMOSFET.

Referring initially to FIG. 2a, an n-type silicon layer 2 is formed on a sapphire substrate 1 using a general SOS structure.

Figure 2B:
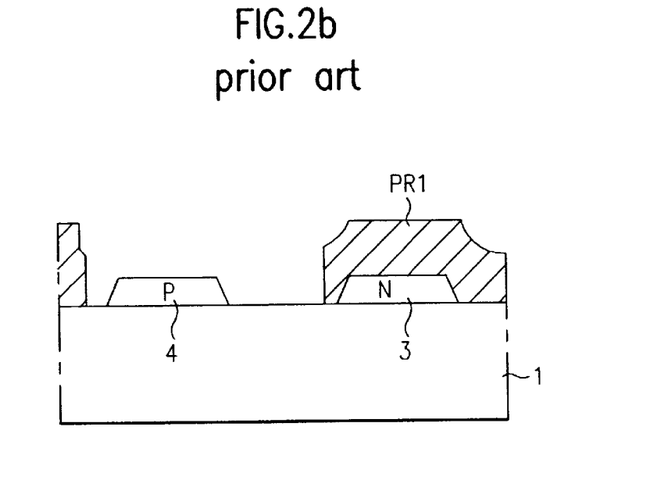

Referring next to FIG. 2b, the silicon layer 2 is selectively patterned by a photolithography process and a photo etching process to form a pair of n-type mesa silicon layers. Subsequently, a photoresist film $PR_1$ is coated on the entire surface of the substrate 1 including the pair of n-type mesa silicon layers and patterned to be removed on one of the pair of n-type mesa silicon layers. Next, p-type impurity ions are implanted into the exposed n-type mesa silicon layer so that the exposed n-type mesa silicon layer 4 becomes a p-type mesa silicon layer 4.

Figure 2C:
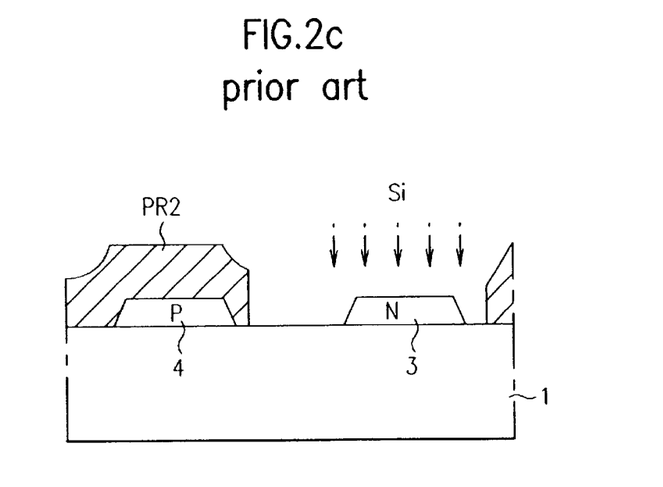

Referring to FIG. 2c, the remainder of photoresist film $PR_1$ is removed. Another photoresist film $PR_1$ is coated on the entire surface including the p-type and n-type mesa silicon layers 4 and 3 and then patterned by an exposure and development process so that the n-type mesa silicon layer 3 is exposed. N-type impurity ions are implanted into the exposed layer 3 for recrystallization of the n-type mesa silicon layer 3. At this time, the ions implanted are silicon ions.

Figure 2D:
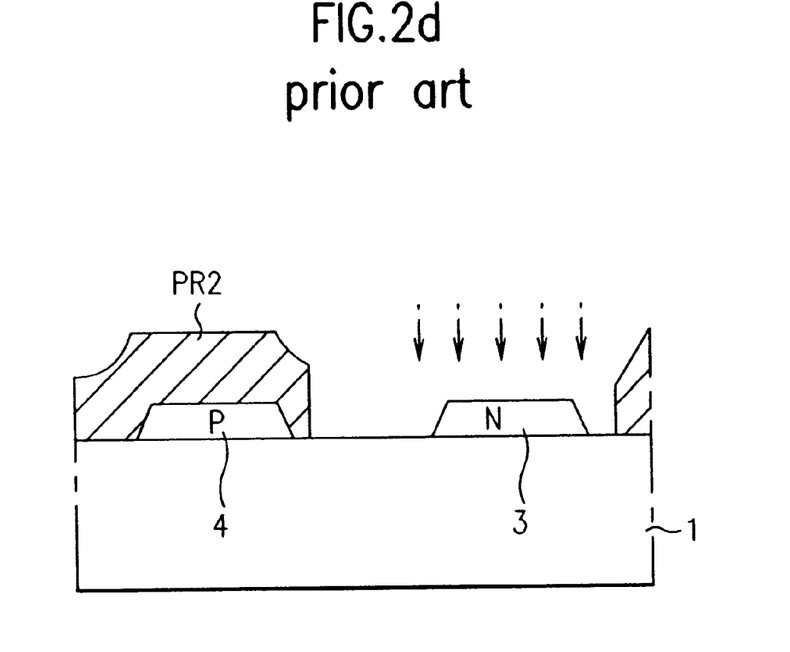

Referring to FIG. 2d, after implanting the ions for recrystallization, n-type impurity ions for adjusting a threshold voltage of a transistor and n-type impurity ions for adjusting punch-through are implanted into the bulk of the n-type and p-type mesa silicon layers 3 and 4.

Figure 2E:
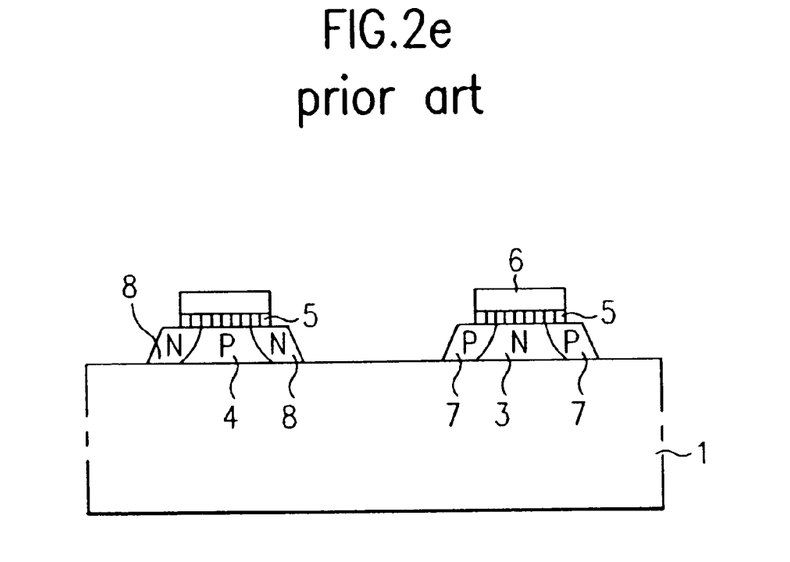

Referring to FIG. 2e, a gate insulating layer 5 and a gate electrode 6 are successively formed on the center of each of the n-type and p-type mesa silicone layers 3 and 4. Next, n-type and p-type impurity regions 8 and 7 are formed in the p-type and n-type mesa silicon layers, respectively, at both sides of the gate electrode 6. In this case, the n-type and p-type impurity regions 8 and 7 are used as source and drain regions.

However, the conventional CMOSFET and the method for fabricating the same have problems. First, since the bulk areas are where source and drain regions and channel regions are formed below a gate electrode in its construction, it is difficult to open a bias contact window with regard to the bulk areas. Further, because a bulk doping process for adjusting the threshold voltage that has important influence on device performance has to be performed in an early step, it is impossible to repair the device performance, thus decreasing the productivity and yield of CMOSFETs.

SUMMARY OF THE INVENTION

Therefore, the present invention is directed to a CMOSFET and a method for fabricating the same that substantially overcome one or more of problems due to the limitations and disadvantages of the related art.

An object of the invention is a CMOSFET using an SOI structure in which bulk source and drain regions of a CMOS device are exposed on a substrate so that the CMOSFET can be repairable, and a method for fabricating the same.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a CMOSFET includes an insulating substrate, a first semiconductor layer of a first conductivity type and a second semiconductor layer of a second conductivity type formed on the insulating substrate and each including a center portion and two edge portions, and spaced apart from each other by a predetermined distance, a third semiconductor layer of a second conductivity type formed to have a predetermined length extending from the edge portions of the first semiconductor layer toward the second semiconductor layer, a fourth semiconductor layer of a first conductivity type formed to have a predetermined length extending from the edges of the second semiconductor layer in symmetry with respect to the third semiconductor layer and a center line of the CMOSFET, an insulating layer formed on the entire surfaces of the first, second, third, and fourth semiconductor layers, and a gate electrode formed between the center portions of the first and second semiconductor layers, among the first, second, third, and fourth semiconductor layers.

In another aspect of the invention, a method for fabricating a CMOSFET includes the steps of forming a semiconductor layer on an insulating substrate, selectively patterning the semiconductor layer to form first and second semiconductor layers having first and second trenches, respectively, opposite to each other and spaced apart from each other by a predetermined distance, selectively implanting first conductivity type impurity ions into the first semiconductor layer, selectively implanting second conductivity type impurity ions into the second semiconductor layer, forming a gate insulating layer on the entire surfaces of the first and second semiconductor layers, forming a gate electrode over the insulating substrate from the trench of the first semiconductor layer to the trench of the second semiconductor layer, implanting second conductivity type impurity ions into the first semiconductor layer at both sides of the trench of the first semiconductor layer to a depth equal to the depth of the first trench so as to form a third semiconductor layer of a second conductivity type, and implanting first conductivity type impurity type into the second semiconductor type at both sides of the trench of the second semiconductor layer to a depth equal to the depth of the second trench so as to form a fourth semiconductor layer of a first conductivity type.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which:

FIG. 3b is a cross-sectional view showing a structure of the CMOSFET, taken along line 3b—3b of FIG. 3a;

FIG. 6b is cross-sectional view showing the structure of the CMOSFET, taken along line 6b—6b of FIG. 6a.

DETAILED DESCRIPTION OF THE PREFERRED EMBODIMENTS

Reference will now be made in detail to the preferred embodiments of the present invention, examples of which are illustrated in the accompanying drawings.

Figure 3A:
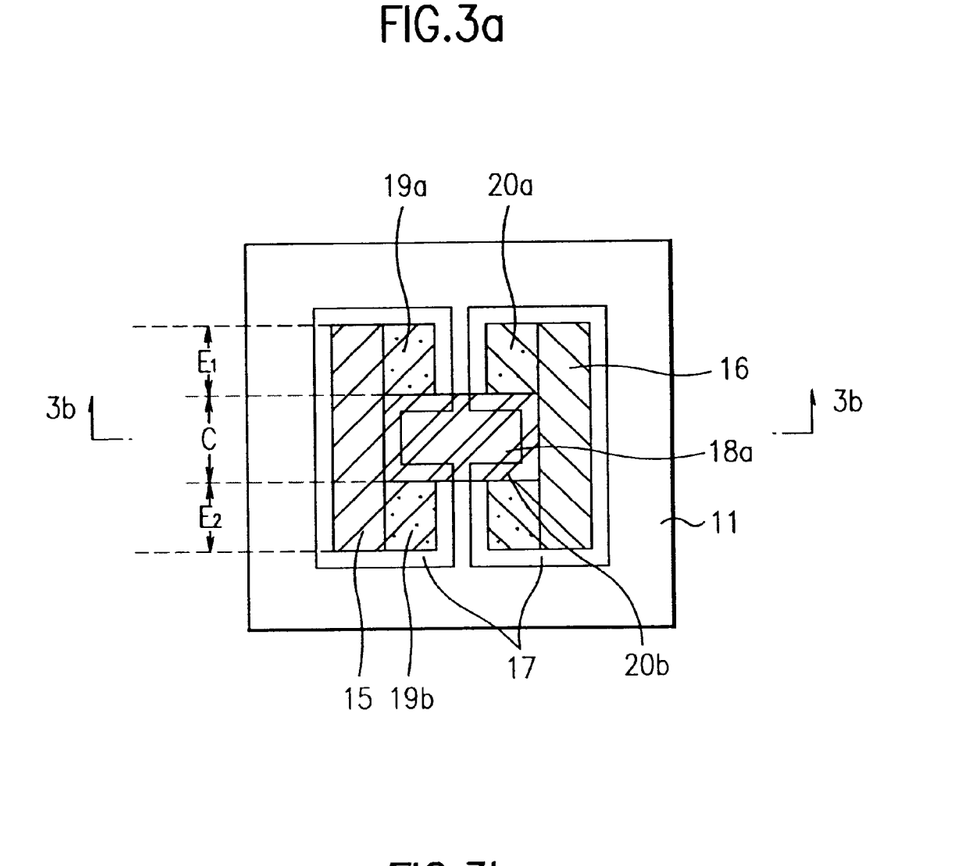
FIG. 3a is a plan view of a CMOSFET according to the present invention.
Figure 3B:
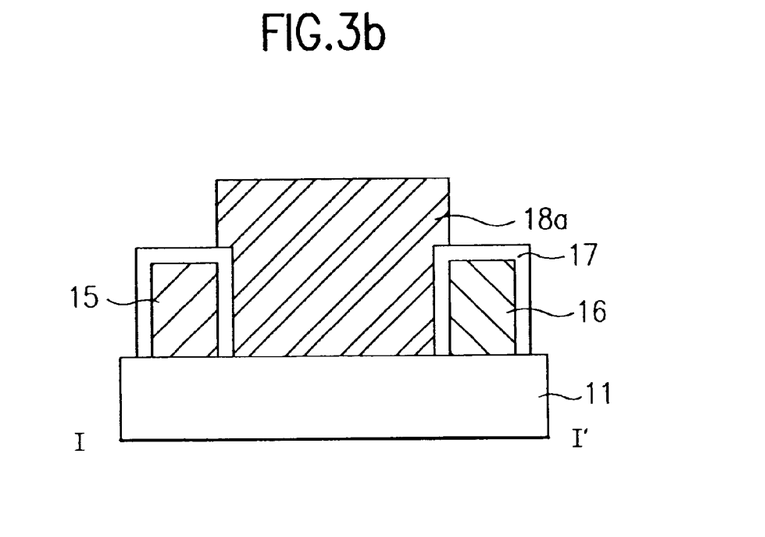

FIG. 3a is a plan view of a CMOSFET and FIG. 3b is a cross-sectional view showing the structure of the CMOSFET, taken along line 3b—3b of FIG. 3a.

A CMOSFET includes an insulating layer 11, p-type and n-type silicon layers 15 and 16, which are a first semiconductor layer of a first conductivity type and a second semiconductor layer of a second conductivity type, respectively, and are formed on the insulating layer 11 and defined as edges E1 and E2 and a center C. N-type heavily doped impurity regions 19a and 19b, spaced apart from each other, are a third semiconductor layer of a second conductivity type of a predetermined length extending from both edges $E_1$ and $E_2$ of the p-type silicon layer 15 toward the n-type silicon layer 16. P-type heavily doped impurity regions 20a and 20b, which are fourth semiconductor layers of a first conductivity type of a predetermined length, extend from edges $E_1$ and $E_2$ in symmetry to the n-type heavily doped impurity regions 19a and 19b.

A gate insulating layer 17 is formed on the entire surface including the n-type and p-type heavily doped impurity regions 19a, 19b, 20a, and 20b and the p-type and n-type silicon layers 15 and 16. A gate electrode 18a is formed between the center C of the p-type silicon layer 15 and the center C of the n-type silicon layer 16, between the n-type and p-type heavily doped impurity regions 19a, 19b, 20a, and 20b.

FIGS. 4a to 4k are plan views showing the process steps of a method for fabricating a CMOSFET, and FIGS. 5a to 5k are cross-sectional views taken along line I–I' of FIGS. 4a to 4k respectively.

Figure 4A:
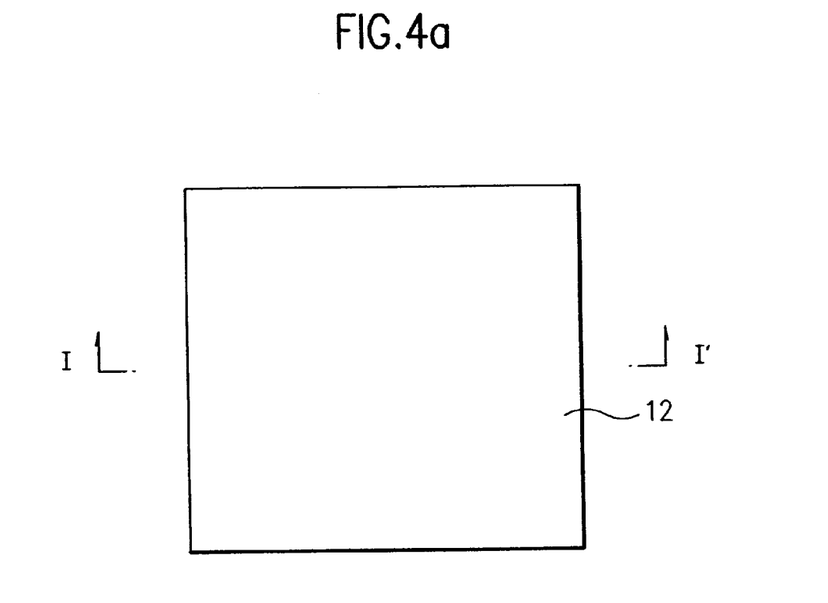
FIGS. 4a to 4k are plan views showing process steps of a method for fabricating a CMOSFET according to a preferred embodiment of the present invention.
Figure 5A:
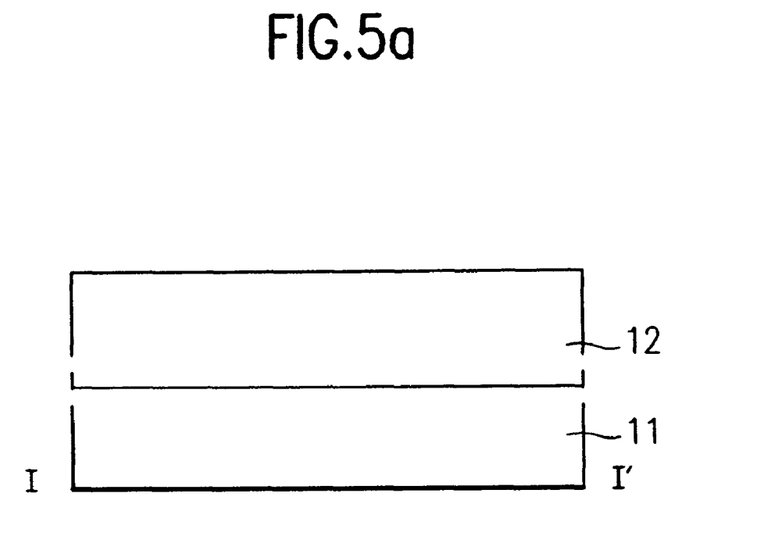
FIGS. 5a to 5k are cross-sectional view showing the process steps of the method for fabricating a CMOSFET, taken along line I–I' of FIGS. 4a to 4k.

Referring initially to FIGS. 4a and 5a, a single crystal silicon layer 12 is formed on an insulating layer 11 that is an oxide layer ($SiO_2$) using an SOI structure, or a sapphire layer using SOS.

Figure 4B:
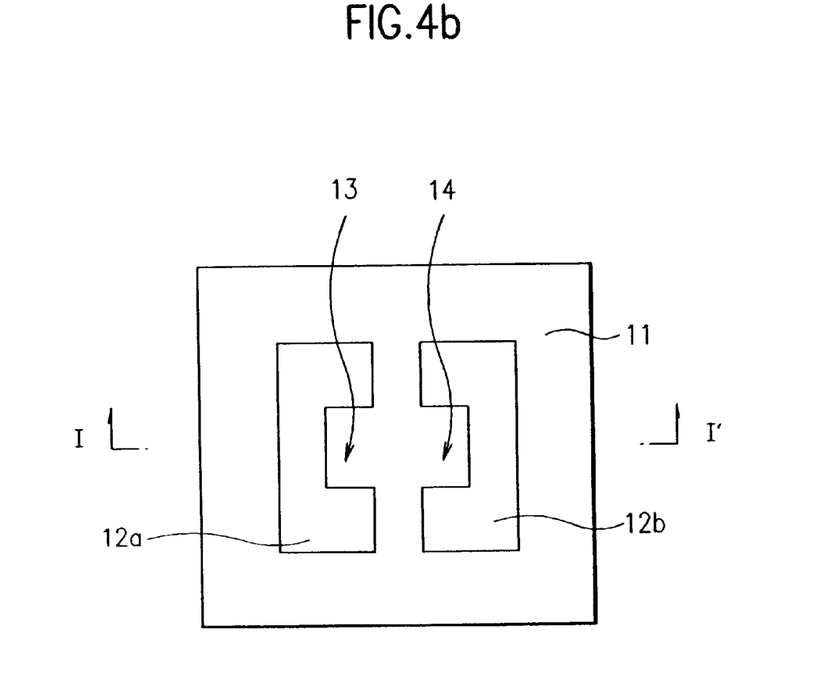
Figure 5B:
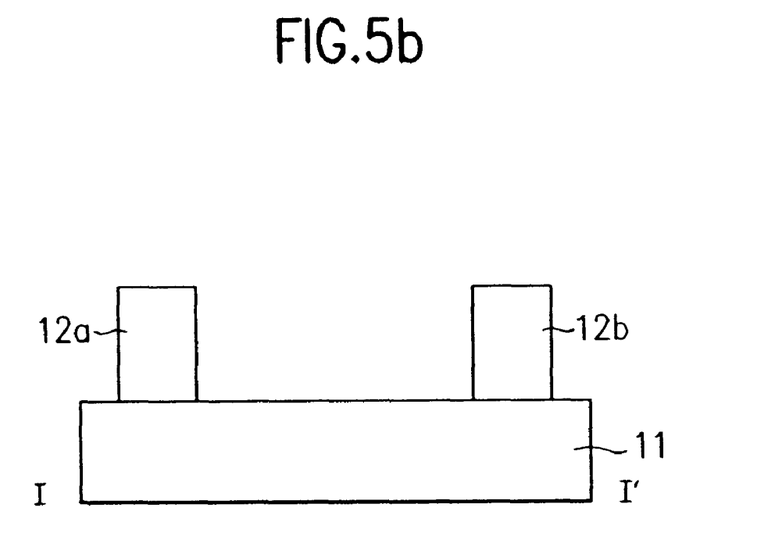

Referring to FIGS. 4b and 5b, the single crystal silicon layer 12 is selectively patterned by a photolithography process and a photo etching process to form first and second silicon layers 12a and 12b having first and second trenches 13 and 14, respectively, which are opposite to each other and spaced apart by a predetermined distance. In this case, predetermined areas of the insulating layer 11 are exposed to form the trenches 13 and 14.

Figure 4C:
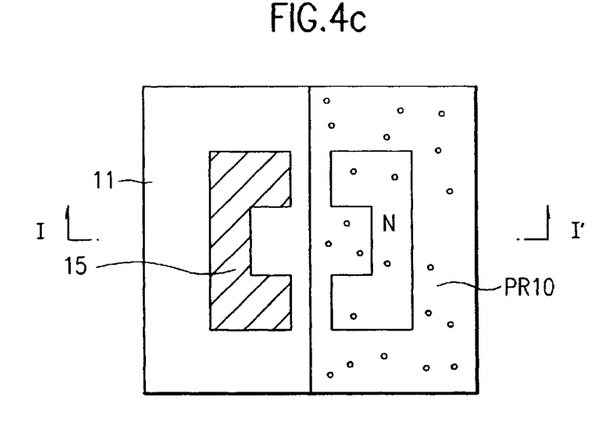
Figure 5C:
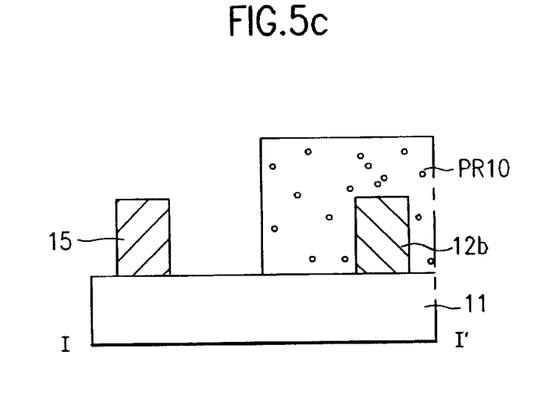

Referring to FIGS. 4c and 5c, a photoresist film $PR_{10}$ is coated on the insulating layer 11 including the first and second silicon layers 12a and 12b and then patterned by an exposure and development process to expose the first silicon layer 12a. Subsequently, using the photoresist pattern $PR_{10}$ as a mask, p-type impurity ions are implanted into the exposed first silicon layer 12a to form a p-type silicon layer 15. The impurity ions implanted may be boron ions.

Figure 4D:
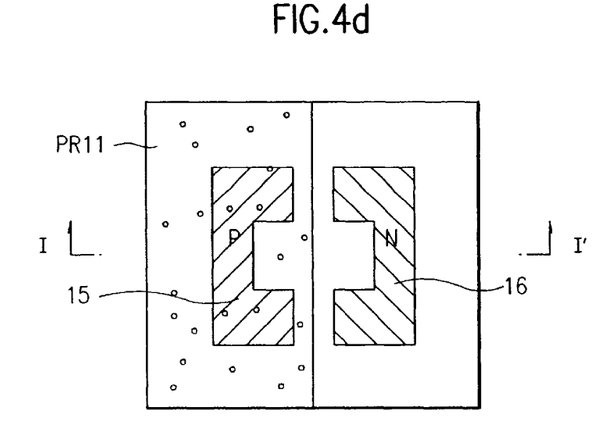
Figure 5D:
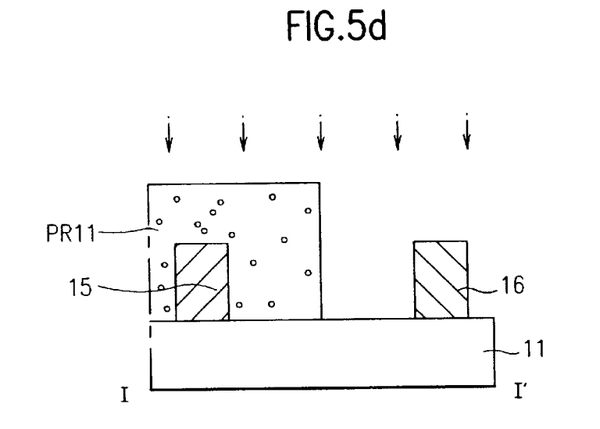

Referring to FIGS. 4d and 5d, the remaining photoresist film $PR_{10}$ is removed. Another photoresist film $PR_{11}$ is coated on the entire surface of the insulating layer 11 including the p-type silicon layer 15 and the second silicon layer 12b and then selectively patterned by an exposure and development process to expose the second silicon layer 12b. Thereafter, using the photoresist pattern $PR_{11}$ as a mask, n-type impurity ions are implanted into the exposed second silicon layer 12b to form an n-type silicon layer 16. At this time, the impurity ions implanted may be either phosphorus ions or arsenic ions. The process of forming these p-type and n-type silicon layers 15 and 16 is for the formation of bulk areas of a CMOSFET. After the above processes, an ion implanting process can be performed to adjust threshold voltage and punch-through values.

Figure 4E:
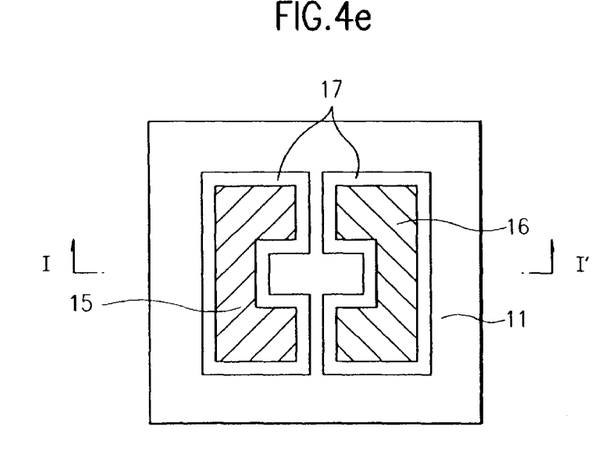
Figure 5E:
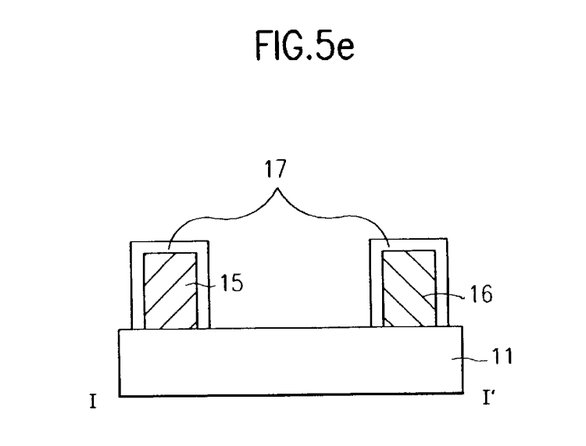

Referring to FIGS. 4e and 5e, the remaining photoresist film $PR_{11}$ is removed. Subsequently, a gate insulating layer 17 is formed on the surface of the p-type and n-type silicon layers 15 and 16. In this case, either an oxide layer or a nitride layer is used as the gate insulating layer 17. If an oxide layer is used, the p-type and n-type silicon layers 15 and 16 are annealed to form it.

Figure 4F:
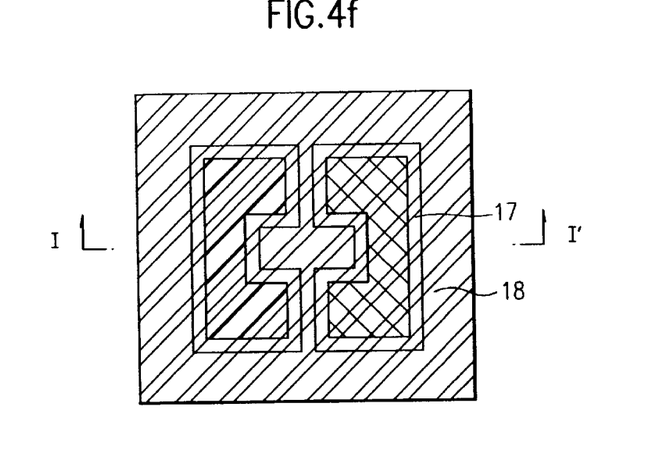
Figure 5F:
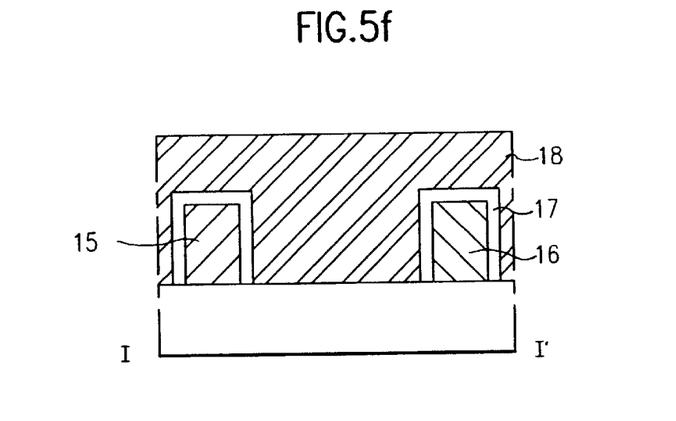

Referring to FIGS. 4f and 5f, a polysilicon layer 18 is deposited on the entire surface of the insulating substrate 11 including the gate insulating layer 17.

Figure 4G:
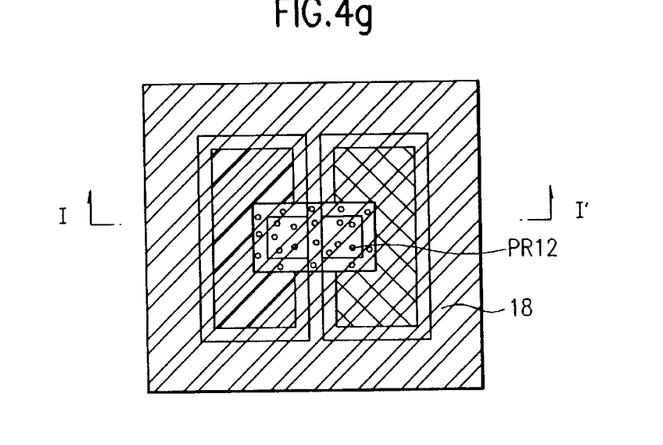
Figure 5G:
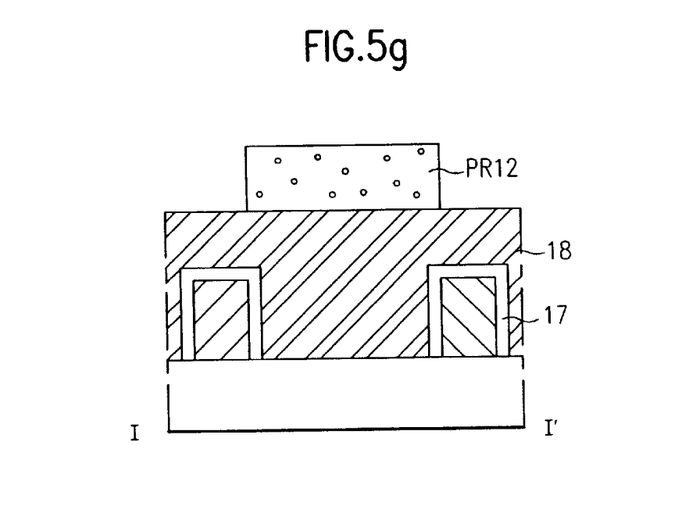

Referring to FIGS. 4g and 5g, a photoresist film $PR_{12}$ is coated on the polysilicon layer and then patterned by an exposure and development process to define the placement of a gate electrode. The photoresist film $PR_{12}$ remains only over the placement of a gate electrode. The gate electrode extends from the first trench 13 to the second trench 14.

Figure 4H:
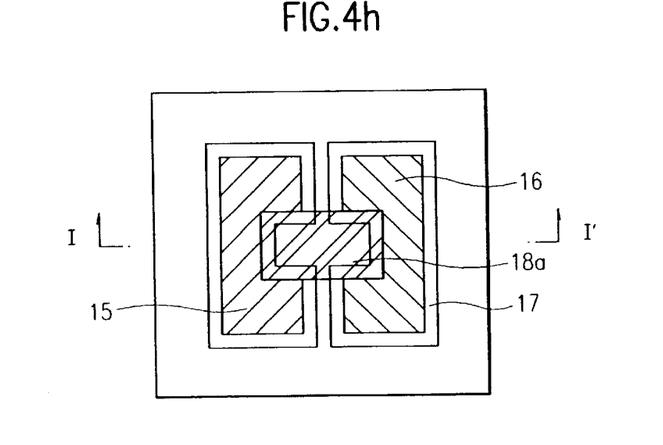
Figure 5H:
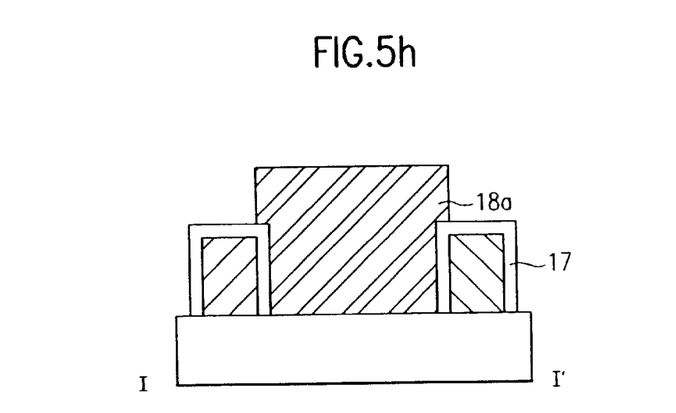

Referring to FIGS. 4h and 5h, using the photoresist pattern $PR_{12}$ as a mask, the polysilicon layer 18 is selectively, anisotropically etched to form a gate electrode 18a. Next, the photoresist film $PR_{12}$ is removed.

Figure 4I:
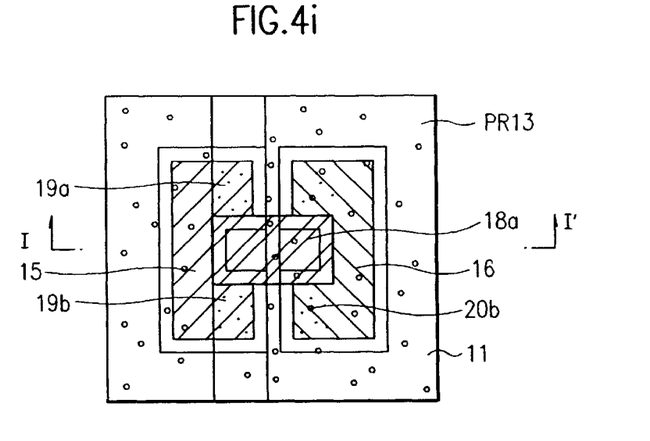
Figure 5I:
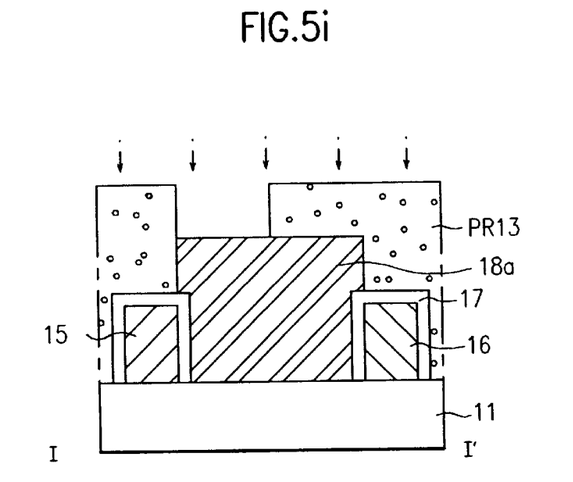

Referring to FIGS. 4i and 5i, still another photoresist film $PR_{13}$ is coated on the entire surface of the insulating layer 11 including the gate electrode 18a and the gate oxide layer 17 and then patterned by an exposure and development process to selectively expose the p-type silicon layer 15 at both sides of the first trench 13. Using the photoresist pattern $PR_{13}$ as a mask, n-type heavily doped impurity ions are implanted into the exposed p-type silicon layer 15 at both sides of the first trench 13 to form n-type heavily doped impurity regions 19a and 19b. Accordingly, the entire process for an n channel MOS transistor is completed. In this case, the n-type heavily doped impurity regions 19a and 19b are used as source and drain regions. The n-type heavily doped impurity regions 19a and 19b are formed to be as deep as the first trench 13 formed in the p-type silicon layer 15.

Figure 4J:
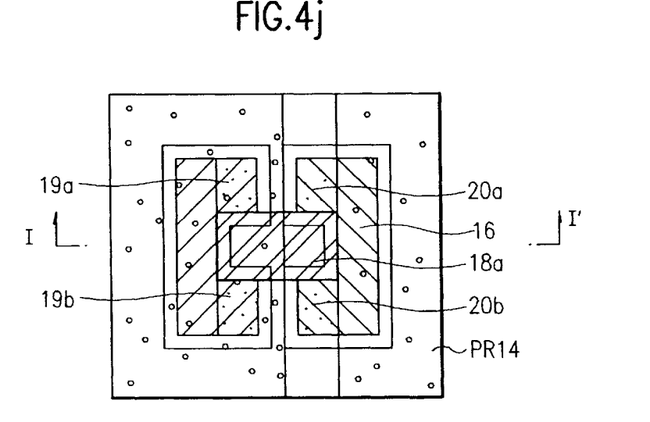
Figure 5J:
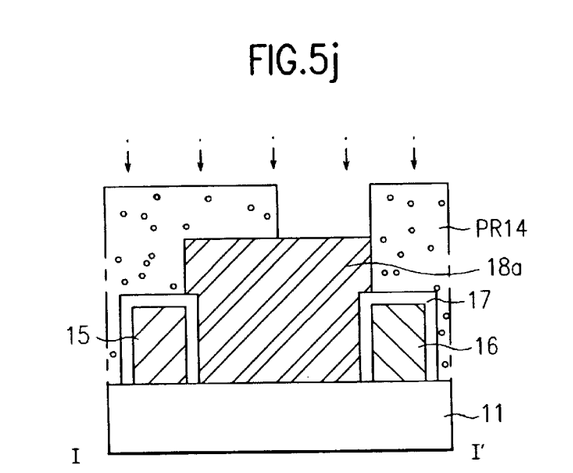

Referring to FIGS. 4j and 5j, the remaining photoresist film $PR_{13}$ is removed. Then, a photoresist film $PR_{14}$ is coated on the entire surface of the insulating layer 11 including the gate electrode 18a and the gate oxide layer 17 and then patterned by an exposure and development process to selectively expose the n-type silicon layer 16 at both sides of the second trench 14. Using the photoresist pattern $PR_{14}$ as a mask, a heavily doped p-type impurity ion-implanting process is performed to form p-type heavily doped impurity regions 20a and 20b in the n-type silicon layer 16 at both sides of the second trench 14, thereby completing the p channel MOS. At this time, the p-type heavily doped impurity regions 20a and 20b are formed to have the same depth as the second trench 14. The heavily doped impurity regions may be also formed under the entire surface at both sides of the second trench 14.

Figure 4K:
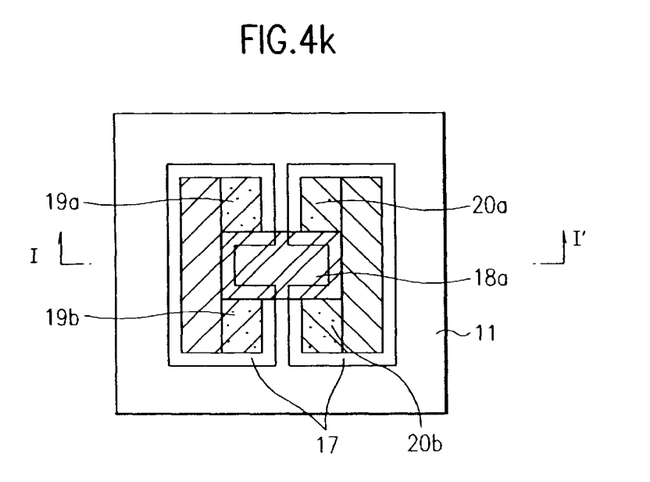
Figure 5K:
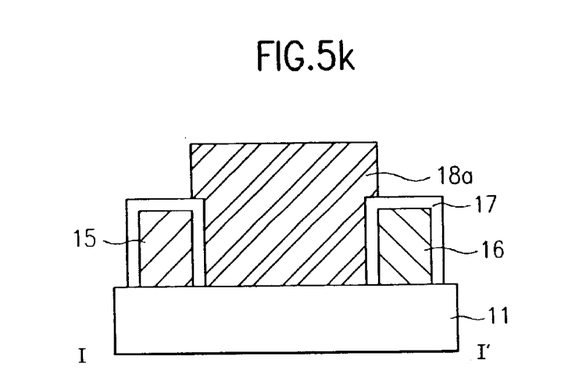

Referring finally to FIGS. 4k and 5k, the remaining photoresist film $PR_{14}$ is removed, thus completing the manufacturing process for a CMOSFET.

Figure 6A:
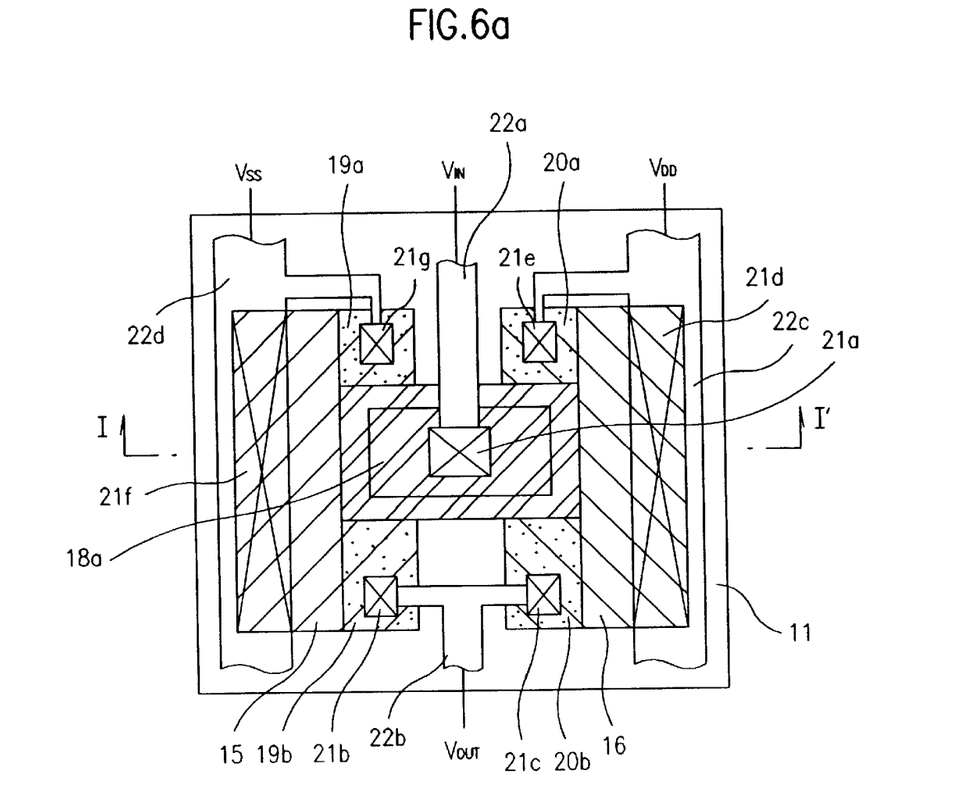
FIG. 6a is a plan view of a CMOSFET after metal wires are formed therein.
Figure 6B:
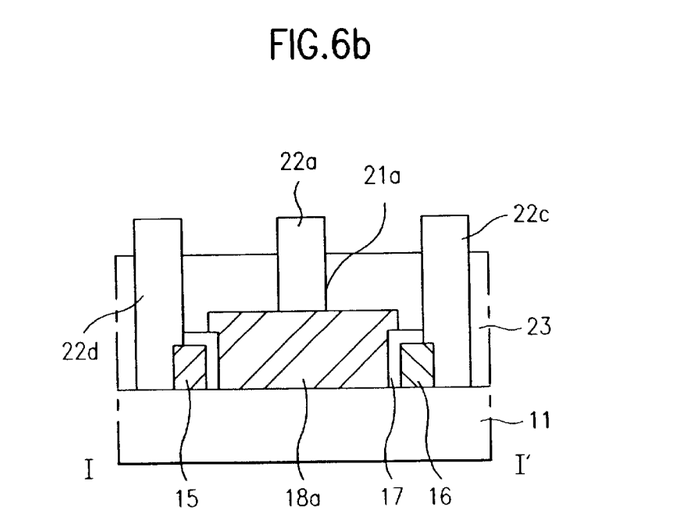

FIG. 6a is a plan view of a CMOSFET after the process of metal wiring and FIG. 6b is a cross-sectional view showing the structure of the CMOSFET, taken along line 6b—6b of FIG. 6a.

First, second, third, fourth, fifth, sixth, and seventh contact portions 21a to 21g, respectively, are formed in the gate electrode 18a of the CMOSFET, predetermined areas of n-type and p-type heavily doped impurity regions 19a, 19b, 20a, and 20b, and ends of the p-type and n-type silicon layers 15 and 16 opposite to the gate electrode 18a. A first metal wire 22a is formed for providing an input voltage $V_{IN}$ for the gate electrode 18a through the first contact portion 21a on the gate electrode 18a. A second metal wire 22b is formed for providing output voltage $V_{OUT}$ through the second and third contact portions 21b and 21c on a drain region 19b of the n-type heavily doped impurity regions 19a and 19b and a drain region 20b of the p-type heavily doped impurity regions 20a and 20b. A third metal wire 22c is formed for connecting plus (+) supply voltage $V_{DD}$ through the fourth contact portion 21d formed at one side of the n-type silicon layer 16 which is a bulk of the PMOSFET and the fifth contact portion 21e formed in the source region 20a of the p-type heavily doped impurity regions 20a and 20b. Also, a fourth metal wire 22d is formed for connecting a minus (–) supply voltage $V_{SS}$ through the sixth contact portion 21f formed at one side of the p-type silicon layer 15 which is a bulk of the PMOSFET and the seventh contact portion 21g formed in the source region 20a of the n-type heavily doped impurity regions 20a and 20b. In this case, as shown in the cross-sectional view, reference number 23 is an insulating layer formed on the entire surface including the gate electrode 18a, and the p-type and n-type silicon layers 15 and 16.

Figure 7:
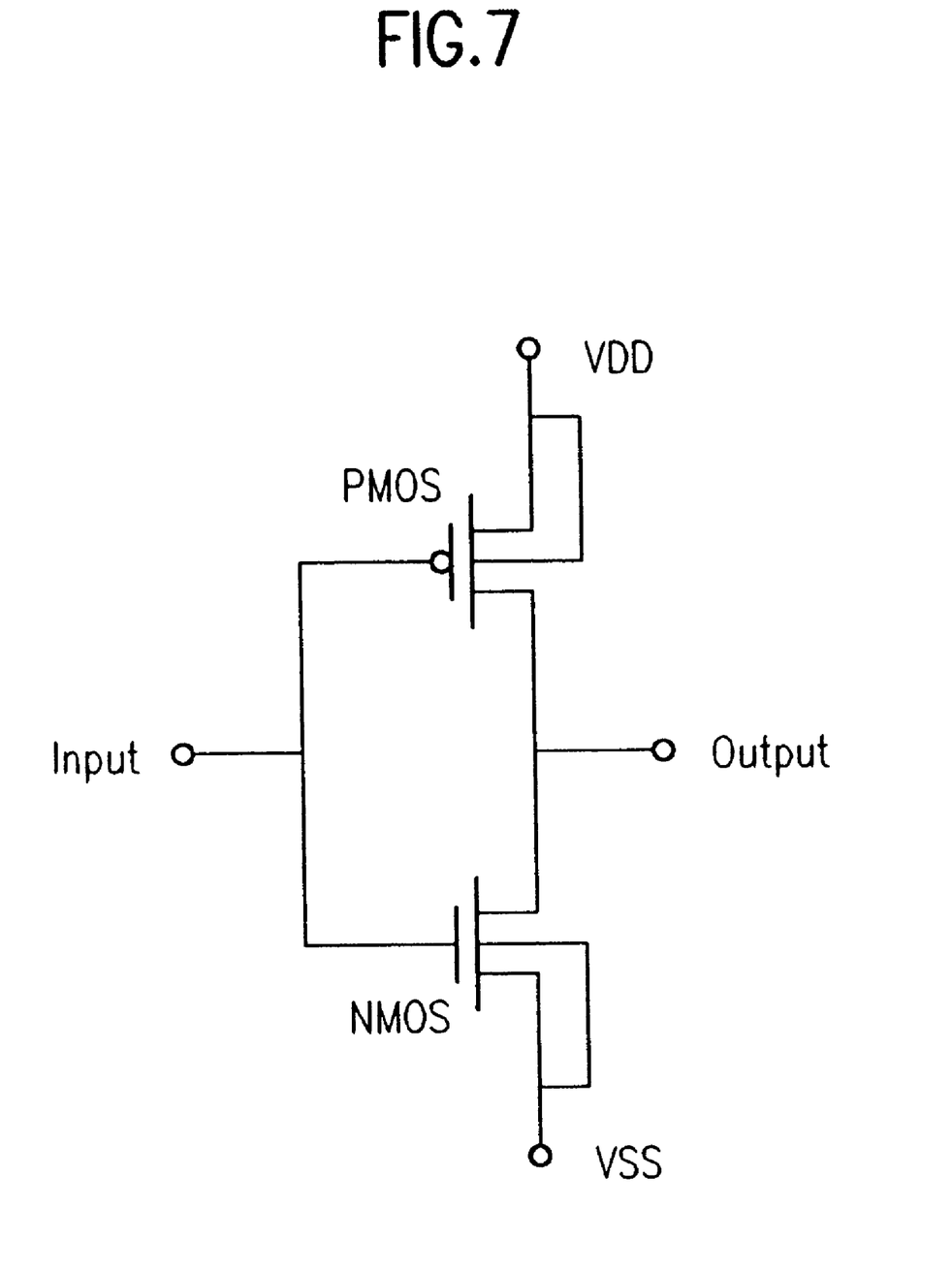
FIG. 7 is a circuit diagram of a CMOSFET according to the present invention.

FIG. 7 is a circuit diagram of a CMOSFET. PMOS and NMOS are transistors connected serially. An input signal $V_{IN}$ is commonly applied to their gate electrodes. The source of the NMOS is connected to the minus (−) supply voltage $V_{SS}$ and the source of the PMOS is connected to the plus (+) supply voltage $V_{DD}$. The drains of the NMOS and PMOS are connected to the common output signal $V_{OUT}$ terminal.

Such a CMOSFET functions as an inverter. By using different characteristics between the threshold voltage of an NMOSFET and that of a PMOSFET, these two transistors are designed to be on/off alternately. That is to say, when an input voltage is very low, the NMOSFET is off and the PMOSFET is on to produce an output voltage with a value of $V_{DD}$. On the other hand, when an input voltage is very high, the NMOSFET is on and the PMOSFET off, to produce an output voltage with a value of $V_{SS}$. In both cases, current cannot flow from $V_{DD}$ to $V_{SS}$, thereby removing unnecessary power consumption.

The CMOSFET of the present invention and the method for fabricating the same have the following advantages. Since the bulk areas of a MOSFET is exposed, it is easy to form bulk biasing contact windows. In addition, even after completing the process of bulk doping for adjusting the threshold voltage, which is important to the performance of a semiconductor device, it is possible to perform an additional ion-implanting process using a photoresist film as a mask so that the performance of a device can be repairable by adjusting a threshold voltage and operating current. Consequently, the productivity and production yield can be improved.

It will be apparent to those skilled in the art that various modification and variations can be made in the repairable CMOSFET and the method for manufacturing and repairing the same of the present invention without departing from the spirit or scope of the inventions. Thus, it is intended that the present invention cover the modifications and variations of this invention provided they come within the scope of the appended claims and their equivalents.

What is claimed is:

1. A CMOSFET having a center line comprising:
an insulating substrate;
a first semiconductor layer of a first conductivity type and a second semiconductor layer of a second conductivity type formed on the insulating substrate, each of the first semiconductor layer and the second semiconductor layer having a center portion and two edge portions, and being spaced apart from each other by a predetermined distance;
a third semiconductor layer of a second conductivity type formed to have a predetermined length extending from the edge portions of the first semiconductor layer toward the second semiconductor layer;
a fourth semiconductor layer of a first conductivity type symmetrically formed with respect to the third semiconductor layer and the center line and having a predetermined length extending from the edges portions of the second semiconductor layer;
a insulating layer formed on the entire surface of the first, second, third, and fourth semiconductor layers; and
a gate electrode formed between the center portions of the first and second semiconductor layers, and being bounded by the first, second, third, and fourth semiconductor layers.

2. The CMOSFET as claimed in claim 1, wherein the insulating substrate comprises sapphire or an oxide layer.

3. The CMOSFET as claimed in claim 1, wherein the first, second, third, and fourth semiconductor layers comprise silicon.

\* \* \* \* \*